United States Patent
Urakawa (10) Patent No.: US 6,781,805 B1
(45) Date of Patent: Aug. 24, 2004

(54) STACKED MOSFET PROTECTION CIRCUIT

(75) Inventor: Yukihiro Urakawa, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 305 days.

(21) Appl. No.: 09/667,174

(22) Filed: Sep. 21, 2000

(30) Foreign Application Priority Data

Sep. 22, 1999 (JP) ............................................. 11-268714
Sep. 13, 2000 (JP) ....................................... 2000-278705

(51) Int. Cl.[7] .............................................. H02H 9/00
(52) U.S. Cl. ......................................... 361/56; 361/111
(58) Field of Search ........................ 361/56, 91.1, 91.7, 361/111, 119, 91.5

(56) References Cited

U.S. PATENT DOCUMENTS

| | | | |
|---|---|---|---|
| 5,637,900 A | | 6/1997 | Ker et al. |
| 5,646,808 A | * | 7/1997 | Nakayama .................... 361/56 |
| 5,672,896 A | * | 9/1997 | Lee et al. .................... 257/360 |
| 5,932,918 A | * | 8/1999 | Krakauer .................... 257/368 |
| 5,946,175 A | * | 8/1999 | Yu ............................... 361/56 |
| 5,946,177 A | | 8/1999 | Miller et al. |
| 6,064,249 A | * | 5/2000 | Duvvury et al. ............ 327/314 |
| 6,249,410 B1 | * | 6/2001 | Ker et al. ................... 361/111 |
| 6,385,028 B1 | * | 5/2002 | Kouno ........................ 361/111 |

FOREIGN PATENT DOCUMENTS

| | | |
|---|---|---|
| EP | 0 224 274 | 6/1987 |
| EP | 0 349 836 | 1/1990 |
| EP | 0 414 499 | 2/1991 |
| EP | 0 523 800 | 1/1993 |
| EP | 0 703 622 | 3/1996 |
| GB | 2 293 290 | 3/1996 |
| JP | 8-288404 | 11/1996 |

* cited by examiner

*Primary Examiner*—Michael Sherry
*Assistant Examiner*—Gary L Laxton
(74) *Attorney, Agent, or Firm*—Oblon, Spivak, McClelland, Maier & Neustadt, P.C.

(57) ABSTRACT

Disclosed is a protection circuit capable of avoiding breakdown of a gate insulating film of a MOSFET and having an appropriate snap-back voltage in terms of reliability. In order to prevent breakdown of a gate insulating film of a MOSFET constituting a stacked protection circuit caused by application of a surge voltage between the gate and the drain of the MOSFET, a single or a plurality of diodes or a MOSFET switch is connected between the gate and the drain of the MOSFET for absorbing the surge voltage. The particular construction permits obtaining a large surge tolerance against the surge voltage entering through, for example, the external power source pad, making it possible to form a protection circuit used in I/O's tolerant to other power sources having an appropriate snap-back voltage against the external surge in assuring the reliability of the semiconductor device.

18 Claims, 6 Drawing Sheets

STACKED MOSFET PROTECTION CIRCUIT

CROSS-REFERENCE TO RELATED APPLICATIONS

This application is based upon and claims the benefit of priority from the prior Japanese Patent Applications No. 11-268714, filed Sep. 22, 1999; and No. 2000-278705, filed Sep. 13, 2000, the entire contents of which are incorporated herein by reference.

BACKGROUND OF THE INVENTION

The present invention relates to protection for ESD (Electro Static Discharge) of a semiconductor device, particularly, to a protection circuit against an ESD surge and an external excess voltage using a stacked MOSFET structure.

In the conventional protection circuit of a semiconductor device, a discharging circuit consisting of combination of a diode and a resistor is formed between the input pad and the ground or between the output pad and the ground so as to discharge the static charge accumulated in the pins of the package in the assembling and mounting procedure so as to prevent the electrostatic breakdown.

On the other hand, the scaling is a very effective means for the high integration degree and the high operating speed of an LSI. In accordance with the scaling of the process, the operation voltage is also subjected to the scaling in view of the voltage tolerance.

However, the I/O interface voltage is slow in the progress of the scaling of the power source voltage, compared with the device, with the result that it is highly required that the low operating voltage and the high I/O interface voltage be satisfied simultaneously. An I/O formation technology tolerant to other power sources is known to the art as a technology that satisfies this requirement without giving rise to a process overhead.

In general, in the case of using an output buffer, the external voltage is higher than the internal operation voltage so as to give rise to a problem in respect of the reliability of the gate insulating film. In other words, a reliability problem represented by TDDB (Time-Dependent Dielectric Breakdown) and HCI (Hot Carrier Injection) tends to be generated.

Figure 1A:
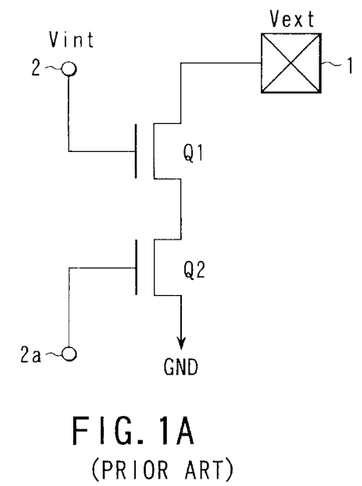
FIG. 1A shows the circuit construction of a conventional stacked MOSFET protection circuit in the normal operation.

In order to overcome the problem noted above, it was customary in the past to use a protection technology utilizing a stacked structure of MOSFFT's, as shown in FIG. 1A. For the sake of simplicity, N-channel MOSFET's alone are stacked in the circuit shown in FIG. 1A. As shown in the drawing, N-channel MOSFET's Q1 and Q2 are connected in series between a pad 1 of an external power source Vext and the ground (GND) so as to form a stacked structure of MOSFET's. An internal power source Vint is applied to an internal voltage terminal 2 connected to the gate of the MOSFET Q1. Incidentally, voltage of 0V to Vint is applied to the terminal 2a connected to the gate of the MOSFET Q2.

In the case of using the stacked structure of MOSFET's shown in FIG. 1A, the gate-drain voltage VGD of the MOSFET and the gate-source voltage VGS of the MOSFET is lower than Vint, i.e., VGD, VGS<Vint, so as to assure the TDDB reliability. Further, since the drain-source voltage VDS divides Vext, the HCI reliability is also ensured.

Concerning the MOSFET Q2, the drain voltage is held at Vint−Vth, where Vth represents the threshold voltage, so as to avoid the problem in terms of the reliability.

Figure 1B:
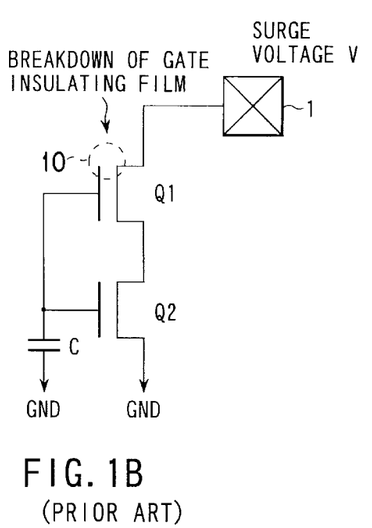
FIG. 1B shows the equivalent circuit of the conventional stacked MOSFET protection circuit during surge voltage application.

In recent years, in a semiconductor device using a different power source technology provided with the external power source Vext and the internal power source Vint, a protection circuit of I/O's tolerant to other power sources having a stacked structure of MOSFET's in which the MOSFET's Q1 and Q2 are connected in series between the pad 1 and GND is used as a protection circuit exhibiting a high surge tolerance against the surge entering through, for example, the pad 1, as shown in FIGS. 1A and 1B.

FIG. 1B shows the equivalent circuit of FIG. 1A and the problem in the case where a surge voltage V is applied to the pad 1 for a short time. The external surge voltage V enters the pad 1 for various reasons. For example, the external surge voltage is generated in the case of ESD in which the charge added to the surrounding portions in the assembling, testing and mounting steps to a system is discharged through the pins of the package.

In the structure shown in FIGS. 1A and 1B, it is possible for the breakdown of the protection circuit to take place in the case where the surge voltage V is applied for a short time to the pad 1. To be more specific, under the state that, although the gate of the MOSFET Q1 is connected to Vint, the power source is not turned on as shown in FIG. 1A, the gate of the MOSFET Q1 bears the ground potential. In addition, since a very large equivalent capacitance is connected to Vint, the gate-drain voltage VGD of the MOSFET Q1 exceeds the withstand voltage of the gate insulating film during application of the surge voltage V. As a result, the MOSFET Q1 is broken down before the snap-back characteristics of the MOSFET effective for the surge absorption perform their functions.

The breakdown process of the MOSFET Q1 during application of the surge voltage V to the pad 1 will now be described with reference to the equivalent circuit shown in FIG. 1B. If the surge voltage V is applied to the equivalent circuit shown in FIG. 1B, the electron-hole avalanche takes place on the channel surface on the drain side of the MOSFET Q1. As a result, a large current flows between the source and drain of the MOSFET Q1, and the surge voltage applied to the external power source pad 1 is rapidly lowered by the discharge current. It follows that the stacked MOSFET protection circuit exhibits excellent snap-back characteristics.

However, since a high surge voltage V is applied to the stacked MOSFET protection circuit consisting of the MOSFET's Q1 and Q2, the greatest gate-drain voltage VGD is applied to the drain edge portion of the gate insulating film of the MOSFET Q1 as denoted by a circle 10 of a broken line in FIG. 1B, giving rise to the problem that the gate insulating film is broken down at the portion denoted by the broken circle 10.

On the other hand, it was attempted to use a protection circuit of one stage MOSFET in which the drain of the MOSFET Q2 is connected directly to the pad 1. In the protection circuit of one stage MOSFET, the drain voltage of the MOSFET Q2 is lowered by an amount equal to the source-drain voltage of the MOSFET Q1 so as to lower the maximum gate-drain voltage VGD applied to the drain edge of the gate insulating film of the MOSFET Q2 so as to suppress the breakdown of the gate insulating film.

Figure 2:
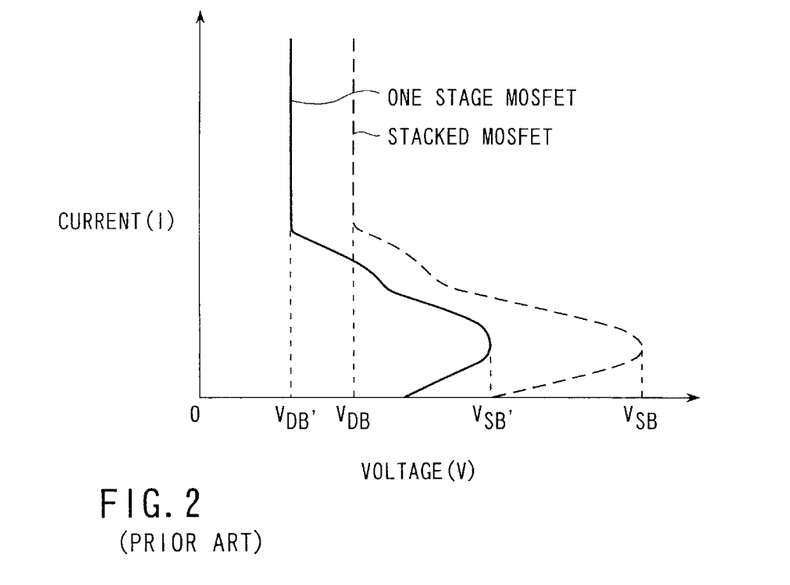
FIG. 2 compares the snap-back characteristics of the stacked MOSFET structure with those of a single stage MOSFET protection circuit.

FIG. 2 compares the snap-back characteristics of the stacked MOSFET protection circuit consisting of the MOSFET's Q1 and Q2 with those of protection circuit of the one stage MOSFET consisting of the MOSFET Q2 alone.

In FIG. 2, the snap-back voltage of the stacked structure is denoted by $V_{SB}$, which is denoted by a thick broken line, the drain voltage in the "ON" state is denoted by $V_{DB}$. The phenomenon called in general a second breakdown causes the snap-back curves in the transition region in which $V_{SB}$ is switched to $V_{DB}$ to show two steps.

On the other hand, the snap-back voltage $V_{SB}$, and the drain voltage $V_{DB}$, under the "ON" state for the one stage MOSFET, which are denoted by a thin solid curve, are lower than the snap-back voltage $V_{SD}$ and the drain voltage $V_{DB}$ under the "ON" state, respectively, for the stacked MOSFET structure, which are denoted by a thick broken curve.

If the surge voltage V caused by, for example, ESD is applied to the pad 1, the protection circuit is repeatedly switched along the curves of the snap-back characteristics shown in FIG. 2, with the result that the protection circuit is capable of performing the surge protection of the semiconductor integrated circuit until the breakdown 10 of the gate insulating film shown in FIG. 1B is made unrecoverable.

As described previously, the snap-back voltage $V_{SB}$, of the conventional one stage MOSFET protection circuit is lower than the snap-back voltage $V_{SB}$ of the protection circuit of the stacked structure so as to produce a merit that the occurrence of the breakdown 10 of the gate insulating film can be suppressed. On the other hand, the conventional one stage MOSFET protection circuit is defective in that it is impossible to set the snap-back voltage $V_{SB}$, at a sufficiently large value relative to the maximum rating of the external power source voltage required for the reliability assurance of the semiconductor device.

As described above, where a stacked structure of MOSFET's is used as a protection circuit against ESD, serious problems are left unsolved. In general, similar problems are generated in the case of using a stacked MOSFET protection circuit against the external surge voltage.

BRIEF SUMMARY OF THE INVENTION

As described above, the conventional stacked MOSFET protection circuit is defective in that the gate insulating film of the first MOSFET tends to be broken down at the edge of the drain. Also, the conventional one stage MOSFET protection circuit is defective in that it is incapable of sufficiently assuring the TDDB and HCI reliability of the semiconductor device.

An object of the present invention, which has been achieved in an attempt to overcome the above-noted problems inherent in the prior art, is to provide a stacked MOSFET protection circuit capable of sufficiently assuring the TDDB and HCI reliability of the semiconductor device and capable of avoiding the breakdown of the gate insulating film.

In the protection circuit of the present invention, a clamping circuit consisting of, for example, a clamp diode is connected between the gate and the source of a MOSFET constituting the stacked MOSFET circuit so as to release an excess voltage and, thus, to avoid the breakdown of the gate insulating film caused by application of the excess voltage between the gate and the drain of the MOSFET. The stacked MOSFET protection circuit provided with such a clamping circuit is adapted for a protection circuit against an external surge entering from, particularly, the external power source pad.

The protection circuit of the present invention is also featured in that, in order to avoid the breakdown, caused by the excess voltage, of the gate insulating film of the MOSFET constituting the stacked protection circuit, the circuit is provided with a switching circuit consisting of a diode that is turned on when the excess voltage is applied between the gate and the drain of the MOSFET and a resistor or consisting of a MOSFET and a resistor. The stacked protection circuit of the MOSFET provided with the particular switching circuit is adapted for use as, particularly, a protection circuit of an input/output buffer consisting of MOSFET's connected to an I/O pad.

According to a first aspect of the present invention, there is provided a protection circuit, comprising first and second MOS transistors having the source of the first MOS transistor connected to the drain of the second MOS transistor; a clamping circuit having first and second terminals, the first terminal being connected to the gate of the first MOS transistor and the second terminal being connected to the drain of the first MOS transistor; and a pad connected to the drain of the first MOS transistor.

It is desirable for the clamping circuit to serve to maintain constant the potential difference between the first and second terminals when the surge voltage enters the pad.

It is desirable for the source and gate of the second MOS transistor to be connected to the ground.

It is desirable for the clamping circuit to consist of a diode. In this case, the cathode of the diode forms the first terminal of the clamping circuit with the anode of the diode forming the second terminal of the clamping circuit.

It is also desirable for the clamping circuit to consist of a plurality of diodes having the cathode of each diode connected to the anode of the adjacent diode, wherein the cathode forming end portion on one side of the plural diodes constitute the first terminal of the clamping circuit, and the anode forming end portion on the other side of the plural diodes constitute the second terminal of the clamping circuit.

According to a second aspect of the present invention, there is provided a protection circuit, comprising first and second MOS transistors having the source of the first MOS transistor connected to the drain of the second MOS transistor; a switching circuit having first, second and third terminals, the first terminal being connected to the gate of the first MOS transistor, the second terminal being connected to the drain of the first MOS transistor, and the third terminal being connected to the internal power source of the semiconductor device, and a pad connected to the drain of the first MOS transistor.

It is desirable for the switching circuit to serve to electrically cut-off the second terminal during the normal operation of the semiconductor device and to maintain constant the potential difference between the first and second terminals when the surge voltage enters the pad.

It is desirable for the switching circuit to consist of a diode. In this case, the cathode of the diode is connected to the gate of the first MOS transistor so as to form the first terminal of the switching circuit, and the anode of the diode forms the second terminal of the switching circuit. Further, the cathode of the diode is connected to the internal power source of the semiconductor device so as to form the third terminal of the switching circuit. More preferably, the cathode of the diode is connected via a resistor circuit to the internal power source of the semiconductor device so as to form the third terminal of the switching circuit.

It is desirable for the switching circuit to consist of a plurality of diodes having the cathode of each diode connected to the anode of the adjacent diode. In this case, the cathode forming end portion on one side of the diodes are connected to the gate of the first MOS transistor so as to form the first terminal of the switching circuit, and the anode forming end portion on the other side of the diodes form the second terminal of the switching circuit. Further, the cathode forming end portion on one side of the diodes are connected to the internal power source of the semiconductor device so as to form the third terminal of the switching circuit. More preferably, the cathode forming end portion on one side of the diodes are connected via a resistor circuit to the internal power source of the semiconductor device so as to form the third terminal of the switching circuit.

More preferably, the number n (n being a natural number) of the plural diodes is selected to meet the relationship n>(Vext−Vint)/$V_F$, where Vext denotes the voltage of the external power source of the semiconductor device, Vint denotes the voltage of the internal power source, $V_F$ denotes the forward voltage of the diode.

More preferably, the switching circuit consists of a third MOS transistor with an inverse conductivity type of the first and second MOS transistors, wherein the source of the third MOS transistor is connected to the gate of the first MOS transistor so as to form the first terminal of the switching circuit, the drain of the third MOS transistor forms the second terminal of the switching circuit, the source of the third MOS transistor is connected to the gate of the third MOS transistor, and the gate of the third MOS transistor is connected via a resistor to the internal power source of the semiconductor device so as to form the third terminal.

More preferably, the threshold voltage Vth of the third MOS transistor is selected to meet the relationship Vth>Vext−Vint, where Vext denotes the voltage of the external power source of the semiconductor device, and Vint denotes the voltage of the internal power source.

Further, according to a third aspect of the present invention, there is provided a protection circuit, comprising first and second MOS transistors of a first conductivity type, third and fourth MOS transistors of a second conductivity type, first and second diodes, first and second resistors, an input/output pad, and first, second and third power sources, wherein:

the source of the first MOS transistor is connected to the drain of the second MOS transistor, the source of the third MOS transistor is connected to the drain of the fourth MOS transistor, and each of the drain of the first MOS transistor and the drain of the third MOS transistor is connected to the input/output pad;

the cathode of the first diode is connected to the gate of the first MOS transistor and to the first power source via the first resistor, the anode of the first diode is connected to the input/output pad, the anode of the second diode is connected to the gate of the third MOS transistor and to the second power source via the second resistor, and the cathode of the second diode is connected to the input/output pad; and the source of the fourth MOS transistor is connected to the third power source, and the source of the second MOS transistor is connected to the ground.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Some embodiments of the present invention will now be described in detail with reference to the accompanying drawings.

Figure 3A:
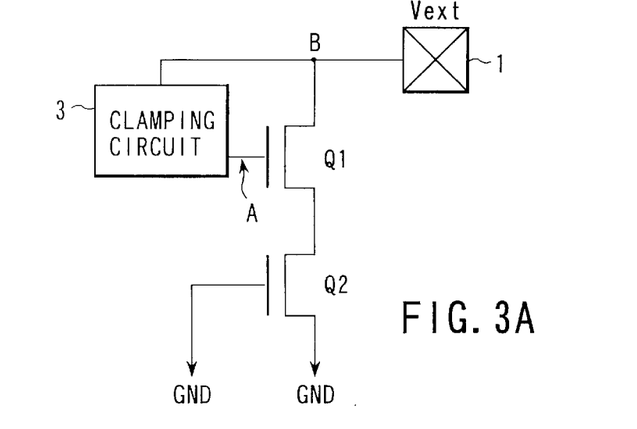
FIG. 3A shows the construction of a stacked MOSFET protection circuit according to a first embodiment of the present invention.

FIG. 3A shows the construction of a stacked MOSFET protection circuit according to a first embodiment of the present invention. The protection circuit, which is intended to protect the internal circuit of the semiconductor device against an external surge entering from, for example, an external power source pad, comprises a pad 1 for supplying an external power source Vext, a stacked MOSFET structure consisting of first and second MOSFET's Q1 and Q2 connected in series, and a clamping circuit 3.

The clamping circuit 3, which is a two terminal circuit having a first terminal connected a node A of the stacked MOSFET protection circuit and a second terminal connected to a node B shown in FIG. 3A, serves to maintain constant the voltage $V_{AB}$ between the first and second terminals A and B regardless of the current value. By connecting the clamping circuit 3, it is possible to prevent the gate-drain voltage VGD of the MOSFET Q1 from exceeding the voltage $BV_{GDm}$ at which the gate insulating film incurs an unrecoverable breakdown at the drain edge.

To be more specific, the clamping circuit 3 can be formed by using a forward voltage $V_F$ of a diode. If a plurality of diodes Di (i=1 to n, n being a natural number) are connected in series as denoted by broken line 3a in FIG. 3B, $V_{AB}$ is equal to $nV_F$, ($V_{AB}=nV_F$). It follows that, if the number n of diodes is made appropriate, it is possible to prevent the unrecoverable breakdown of the gate insulating film occurring in the drain edge of the MOSFET Q1 while maintaining a function required for assuring the TDDB and HCI reliability of the semiconductor device in the normal operation.

Figure 3B:
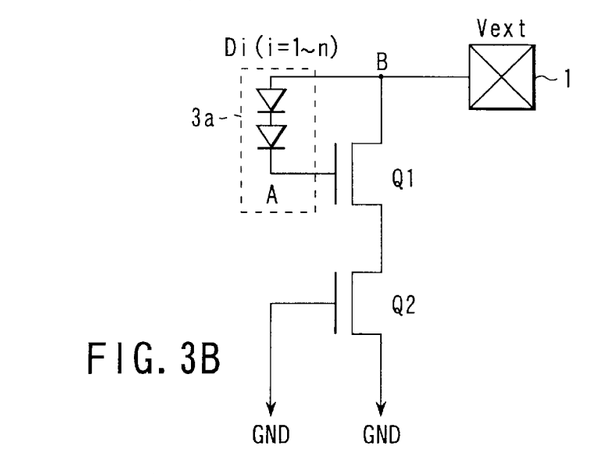
FIG. 3B shows the construction of a stacked MOSFET protection circuit using diodes according to the first embodiment of the present invention.

Incidentally, if the MOSFET Q2 is of a normally-off type, the protection circuit can be put in an "OFF" state during the normal operation of the semiconductor integrated circuit. Thus, the stacked MOSFET protection circuit is capable of providing a protection circuit exhibiting a value of the snap-back voltage VSB adapted for the reliability assurance of the semiconductor device without giving any detrimental effect to the normal operation.

The operation of the stacked MOSFET protection circuit will now be described more in detail with reference to FIG. 3C. Specifically, a solid line in FIG. 3C denotes the surge absorption wave form in node B shown in FIGS. 3A and 3B. On the other hand, a thick broken line in FIG. 3C denotes the surge absorption wave form in node A shown in FIGS. 3A and 3B.

Figure 3C:
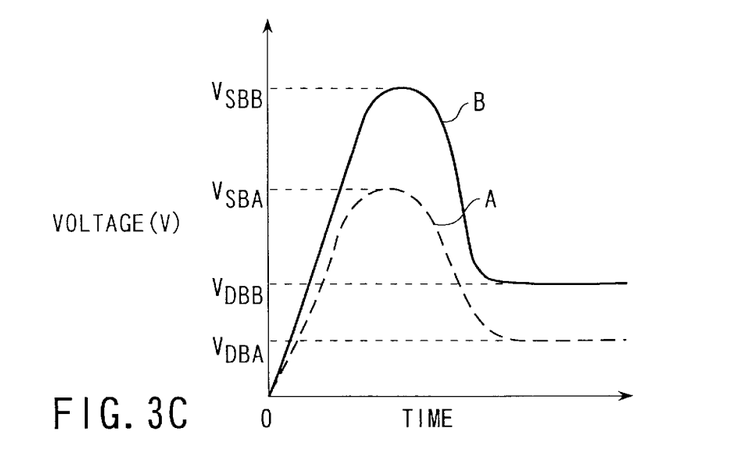
FIG. 3C shows the surge absorption wave form of the stacked MOSFET protection circuit according to the first embodiment of the present invention.

As shown in FIG. 3C, the difference between the snap-back voltage $V_{SBB}$ in node B and the snap-back voltage $V_{SBA}$ in node A and the difference between the voltage $V_{DBB}$ in node B and the voltage $V_{DBA}$ in node A when the MOSFET's Q1 and Q2 are turned on correspond to the terminal voltage $V_{AB}$ of the clamping circuit 4 shown in FIG. 3A or the clamp voltage $nV_F$ of the clamp diode $D_i$ connected in series as shown in FIG. 3B. AS described above, even if a high surge voltage $V_{SBB}$ is applied to the pad 1, the voltage at node A is clamped at the level shifted voltage shifted by $V_{AB}$ or $nV_F$ from the voltage at node B, making it possible to prevent the breakdown of the gate insulating film of the MOSFET Q1.

A stacked MOSFET protection circuit according to a second embodiment of the present invention will now be described with reference to FIG. 4A. The stacked MOSFET protection circuit of the second embodiment is a circuit performing the function of an input and output buffer connected to an I/O pad of the semiconductor device and also performs the function of protecting the internal circuit of the semiconductor device from the external surge entering through the I/O pad.

Figures 4A, 4B:
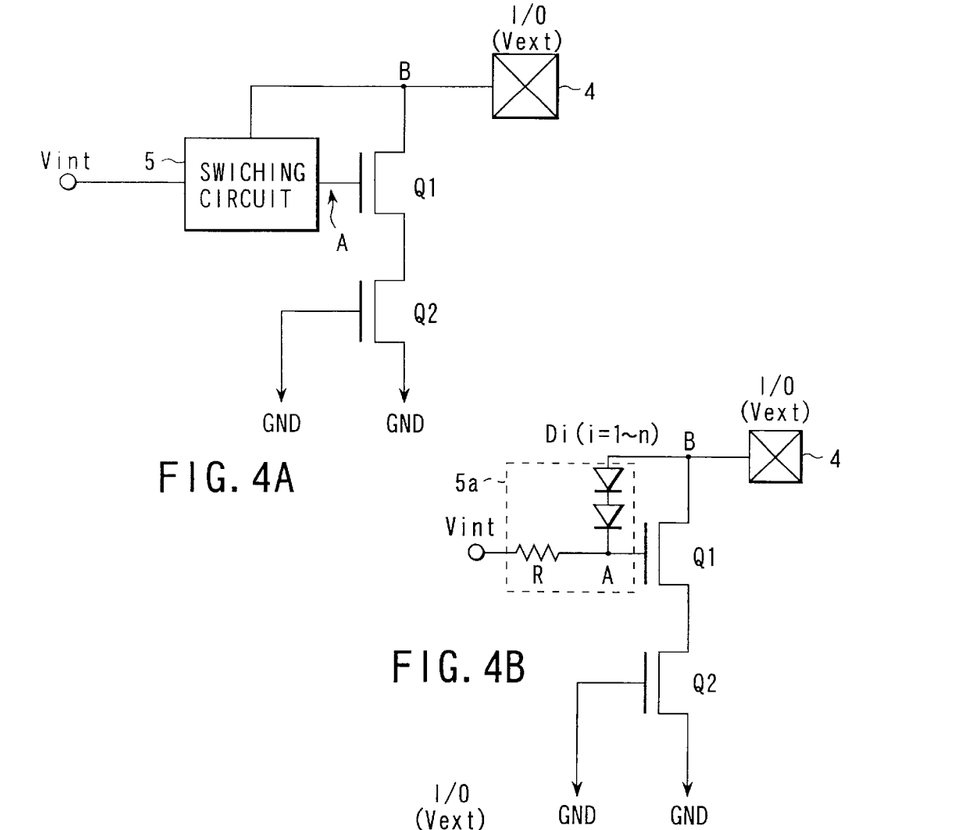
FIG. 4A shows the stacked MOSFET protection circuit according to a second embodiment of the present invention.
FIG. 4B shows the construction of a stacked MOSFET protection circuit using diodes and a resistor according to the second embodiment of the present invention.

The stacked MOSFET protection circuit shown in FIG. 4A comprises a stacked MOSFET structure consisting of the first and second MOSFET's Q1 and Q2 connected in series, an I/O pad 4, and a switching circuit 5. The stacked MOSFET'S Q1 and Q2 constitutes an output buffer circuit connected to the I/O pad 4. As shown in the drawing, the switching circuit 5 including a resistor circuit for determining the output impedance of the buffer circuit and a supply terminal of the internal power source Vint serving to impart a gate bias is connected between the gate and the drain of the MOSFET Q1.

The switching circuit 5 is a 3-terminal circuit having first, second and third terminals. The first and second terminals of the switching circuit 5 are connected to nodes A and B, respectively, of the stacked MOSFET protection circuit, and the third terminal of the switching circuit 5 is connected to the supply terminal of the internal power source Vint.

A switching element is connected between the first and second terminals.

The operation of the switching circuit 5 will now be described. Where the stacked MOSFET's Q1 and Q2 perform the normal operation as an output buffer connected to the I/O pad 4, the switching element is in an "OFF" state, and the gate bias voltage VG of the MOSFET Q1 required for operating the output buffer circuit is supplied from the first terminal connected to node A. It should be noted that the gate bias voltage VG is a voltage of the internal power source voltage Vint supplied to the third terminal and outputted from the first terminal via the switching circuit 5 including the resistor circuit.

Where the stacked MOSFET's Q1 and Q2 absorb the external surge voltage entering through the I/O pad 4, the switching element is turned "ON". The switching circuit 5 is operated to permit the difference $V_{AB}$ constant between the voltage of the second terminal connected to node B and the voltage of the first terminal connected to node A regardless of the current value flowing from the second terminal that is under the "ON" state.

If the switching circuit 5 performing the particular function is connected, it is possible to prevent the gate-source voltage VGD of the MOSFET Q1, which is equal to $V_{AB}$, from exceeding the voltage $BV_{GDm}$ at which an unrecoverable breakdown of the gate insulating film occurs at the drain edge.

Also, during the normal operation, the switching circuit 5 is detached from the drain (node B) of the MOSFET Q1, and the bias voltage VG during the normal operation is supplied from the internal power source Vint to the gate (node A) of the MOSFET Q1 through the switching circuit 5. As a result, the stacked MOSFET protection circuit of the second embodiment performs the function of an output buffer connected to the I/O pad and also performs the function of protecting the internal circuit of the semiconductor device from the external surge entering through the I/O pad.

A stacked MOSFET protection circuit in which the switching circuit 5 is formed of diodes and a resistor will now be described as a first example of the second embodiment of the present invention.

FIG. 4B shows a stacked MOSFET protection circuit in which a switching circuit 5a denoted by a broken line is formed of diodes and a resistor. The protection circuit comprises an I/O pad 4 of a semiconductor device, a stacked MOSFET structure consisting of the first and second MOSFET's Q1 and Q2 connected in series, an internal power source terminal for supplying the internal power source Vint of the semiconductor device, an i-number of diodes $D_i$, i being 1 to n, and n being a natural number, and a resistor R. A power source voltage Vext is supplied from the outside to the I/O pad 4.

The number n of the diodes $D_i$ is obtained from the external power source voltage Vext and the internal power source voltage Vint of the semiconductor device by formula (1) given below:

$$n > (\text{Vext}-\text{Vint})/V_F \tag{1}$$

where $V_F$ represents the forward voltage of the diode.

If the number n of diodes is determined to meet formula (1) given above, it is possible to prevent the current of the external power source from flowing into the diodes $D_i$ connected in series, even if the external power source voltage Vext is applied to node B and the internal power source voltage Vint, which is lower than the external power source voltage Vext, is applied to node A during normal operation of the semiconductor device. It follows that, if Vext−Vint is, for example, about 0.5V, it suffices to connect a single diode. Also, if the difference between Vext and Vint is not lower than 1V, it is necessary to connect at least two diodes.

If a surge voltage V higher than the external power source voltage Vext is applied to the pad 4 in the stacked MOSFET protection circuit provided with a single or a plurality of diodes $D_i$, the potential difference $V_{AB}$ between node B and node A is kept constant at $nV_F$, and it is possible to prevent the breakdown of the gate insulating film at the drain edge portion of the MOSFET Q1 because the impedance of the diodes Di is much lower than that of the resistor R.

During normal operation of the semiconductor device, the gate-drain voltage VGD of the MOSFET Q1 is lower than $nV_F$ as apparent from formula (1) given above. Thus, the series-connected circuit of the diodes $D_i$ connected to node B is cut-off as an "OFF" state. Also, the bias voltage VG required for operating the output buffer is supplied from Vint (VG=Vint in this case) to the gate of the MOSFET Q1 through the resistor R. It follows that the stacked MOSFET protection circuit exhibits a suitable snap-back voltage for assuring the reliability of the semiconductor device without giving any detrimental effect to the normal operation as an output buffer. Incidentally, the resistor R serves to protect the internal circuit of the semiconductor device when a high surge voltage V is applied to the external power source pad 4 to permit a large current to flow through the diodes $D_i$ into the internal power source terminal.

Figure 4C:
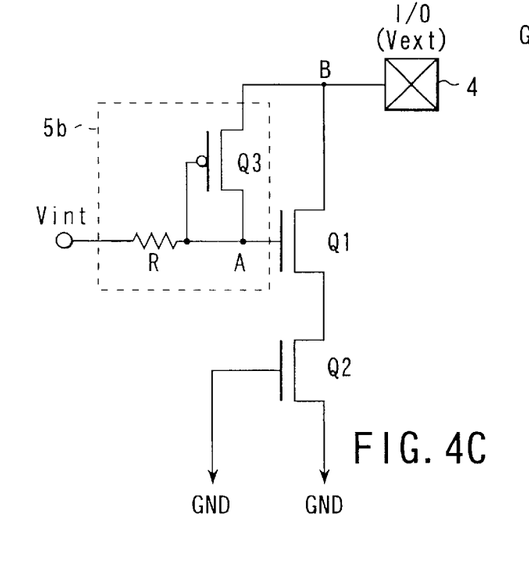
FIG. 4C shows the construction of a stacked MOSFET protection circuit using a MOSFET and a resistor according to the second embodiment of the present invention.

A stacked MOSFET protection circuit, in which the switching circuit 5 is formed of a MOSFET and a resistor, will now be described as a second specific example of the second embodiment of the present invention.

FIG. 4C shows the second specific example of the second embodiment of the present invention, in which a switching circuit 5b surrounded by a broken line consists of a P-channel MOSFET and a resistor R. The protection circuit shown in FIG. 4C comprises and I/O pad 4 of a semiconductor device, a stacked MOSFET structure consisting of the first and second MOSFET's Q1 and Q2 connected in series, an internal power source terminal for supplying the internal power source Vint of the semiconductor device, a P-channel MOSFET Q3 performing a switching function, and a resistor R. The external power source Vext is supplied to the I/O pad 4.

The threshold voltage Vth of the P-channel MOSFET Q3 performing a switching function is obtained from the external power source voltage Vext and the internal power source voltage Vint by formula (2) given below:

$$Vth > Vext - Vint \quad (2)$$

If the threshold voltage Vth of the P-channel MOSFET Q3 performing a switching function is determined to meet formula (2) given above, it is possible to prevent the current of the external power source from flowing into the P-channel MOSFET Q3 because the P-channel MOSFET Q3 is in an "OFF" state even if the external power source voltage Vext is applied to node B and the internal power source voltage Vint lower than Vext is applied to node A during normal operation of the semiconductor device.

If a surge voltage V higher than the external power source voltage Vext is applied for a short time to the I/O pad 4 of the stacked MOSFET protection circuit provided with the P-channel MOSFET Q3, the P-channel MOSFET Q3 is rendered "ON" as described previously in conjunction with FIG. 1B because the internal power source terminal Vint is connected to the ground via a large equivalent capacitance C. In this case, the potential difference $V_{AB}$ between anode B and anode A is given by formula (3):

$$V_{AB} = (Vext - Vint) * R_{ON}/(R_{ON} + R) \quad (3)$$

where $R_{ON}(R_{ON} < R)$ represents the "ON" resistance of the P-channel MOSFET Q3.

By making $R_{ON}$ equivalent to the impedance of the resistor R, the surge voltage Vext is divided into the terminal voltages of $R_{ON}$ and R.

Since the potential difference $V_{AB}$ between node B and node A is as given by formula (3) while a surge voltage is kept applied to the I/O pad 4, it is possible to prevent the breakdown of the gate insulating film in the drain edge portion of the MOSFET Q1, if the potential difference $V_{AB}$ meets the relationship given in formula (4):

$$V_{AB} < Vext - Vint \quad (4)$$

During normal operation of the semiconductor device, the P-channel MOSFET Q3 connected to node B is cut-off as an "OFF" state, as denoted by formula (2). Also, a bias voltage required for operation as an output buffer is supplied from the internal power source terminal Vint (VG=Vint in this case) to the gate of the MOSFET Q1 through the resistor R. It follows that the stacked MOSFET protection circuit shown in FIG. 4C exhibits ESD endurance for assuring the reliability of the semiconductor device without giving any detrimental effect to the normal operation as the output buffer.

Incidentally, the resistor R serves to protect the internal circuit when a high surge voltage is applied to the external power source pad 1 to permit a large current to flow into the internal power source terminal through the P-channel MOSFET Q3. The surge absorption wave form of the stacked MOSFET protection circuit shown in FIGS. 4A, 4B and 4C is equal to the surge absorption wave form shown in FIG. 3C.

As described above, the potential of node A follows the potential of node B even if a high surge voltage is applied to the I/O pad 4. AS a result, the potential difference $V_{AB}$ between node B and node A is kept constant, making it possible to prevent the breakdown of the gate insulating film of the MOSFET Q1.

Figure 5A:
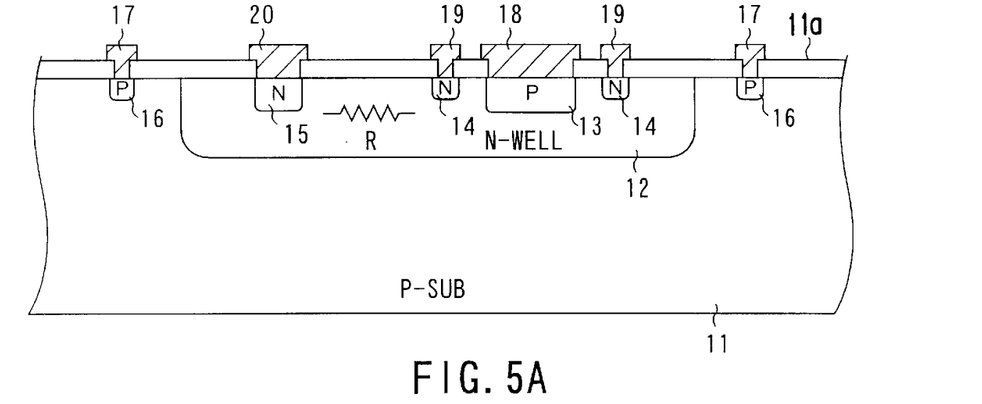
FIG. 5A is a cross sectional view showing the construction of switching (clamping) elements of a stacked MOSFET protection circuit according to a third embodiment of the present invention.
Figure 5B:
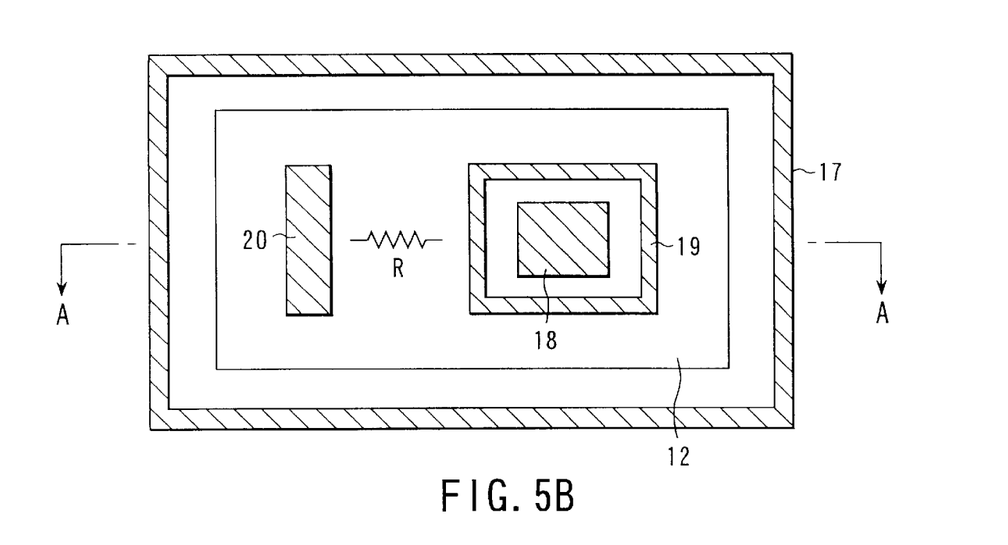
FIG. 5B shows a plan view of switching (clamping) elements of the stacked MOSFET protection circuit according to the third embodiment of the present invention.

The construction of a stacked MOSFET protection circuit according to a third embodiment of the present invention will now be described with reference to FIGS. 5A and 5B. Specifically, FIG. 5A is a cross sectional view showing the construction of a region in which a clamp diode and a resistor R are formed, with FIG. 5B showing the pattern of the region. Incidentally, FIG. 5A is a cross sectional view along the line A—A shown in FIG. 5B. This example covers the case where a single PN junction diode is formed in an N-well.

As shown in FIG. 5A, an N-well 12 forming a main body of the resistor R is formed in a P-type silicon substrate 11, and a P-type diffusion layer 13 is formed at one end portion of the N-well 12 so as to form a diode consisting of a PN junction, which is connected to one electrode of the resistor R. Incidentally, an N-type diffusion layer 14 is formed in a manner to surround the diode. The N-type diffusion layer 14 provides one ohmic contact for connecting the resistor R to the cathode of the diode and serves to permit the resistance value of the resistor R to be close to the design value with a high accuracy.

An N-type diffusion layer 15 is formed within the N-well 12 so as to provide the other ohmic contact of the resistor R. Further, a P-type diffusion layer (guard ring) 16 for the channel cut is formed in a manner to surround the N-well 12 so as to improve the isolation properties of PN junction between the N-well 12 to which a high surge voltage is applied and the P-type silicon substrate. The P-type diffusion layer 16 serves to cut off an N-type inversion layer that is likely to expand on the upper surface of the P-type silicon substrate so as to improve the isolation properties of the N-well 12 under a high voltage.

Reference numeral 17 shown in the drawings denotes an electrode of the guard ring mounted to the P-type diffusion layer 16. A reference numeral 18 denotes an electrode of node B shown in FIG. 4B. A reference numeral 19 denotes an electrode of node A. Further, a reference numeral 20 denotes an electrode connected to the internal power source Vint. FIG. 5B shows the plan view of these structures. Incidentally, a reference numeral 11a denotes an insulating film covering the surface of the silicon substrate 11.

Figure 6:
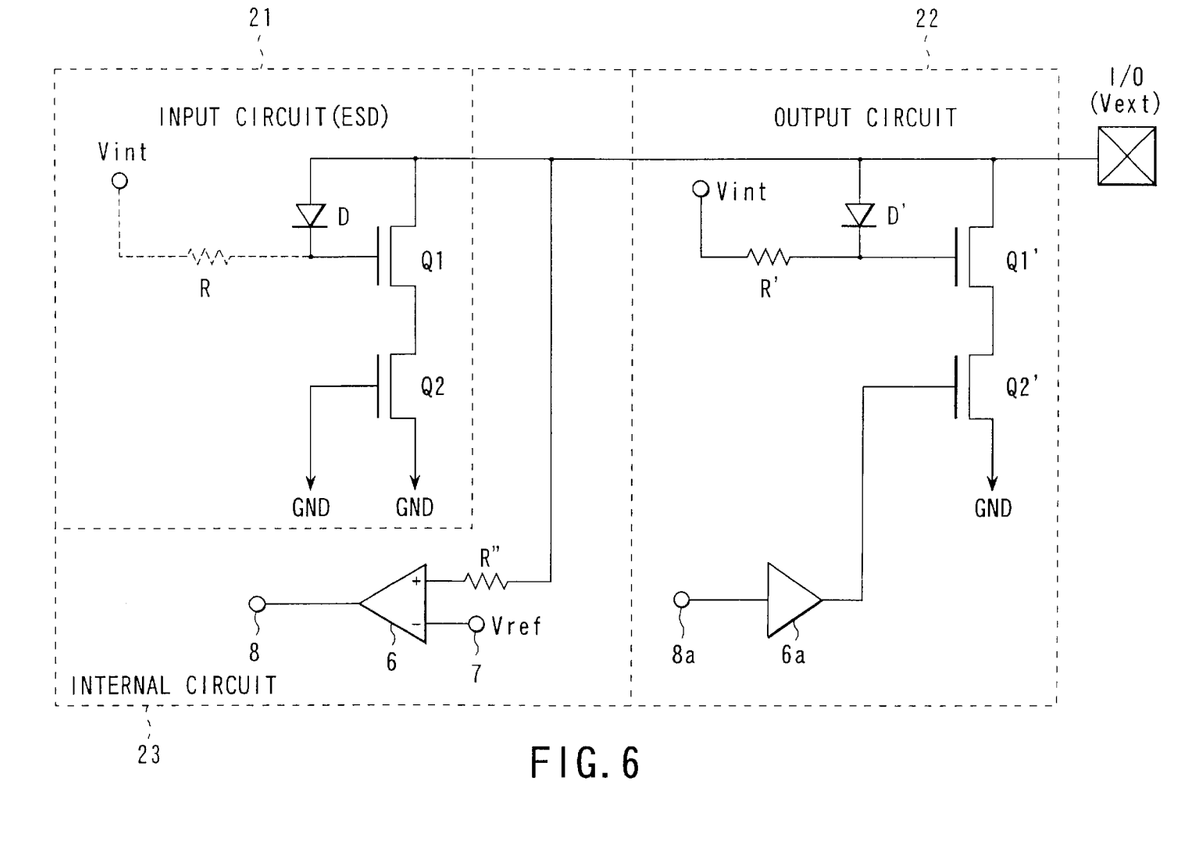
FIG. 6 shows various applications of a stacked MOSFET protection circuit according to a fourth embodiment of the present invention.

FIG. 6 shows a specific example of applying a stacked MOSFET protection circuit according to a fourth embodiment of the present invention to an input/output portion of a semiconductor device. The fourth embodiment is directed to various combinations of the stacked MOSFET protection circuits of the present invention which are connected between the I/O pad of the semiconductor device and the internal circuit.

The input circuit denoted by a solid line and surrounded by a broken line 21 in FIG. 6 is a surge protection circuit provided with a clamp diode D described previously in conjunction with FIG. 3B. On the other hand, the output circuit surrounded by a broken line 22 is a protection circuit provided with an output buffer function consisting of MOSFET's Q1', Q2', a diode D' and a resistor R'. Incidentally, a reference numeral 6a denotes an front stage output buffer.

In the internal circuit surrounded by the broken line 23, an I/O pad is connected to a connection terminal 8 via an operational amplifier 6. A protective resistor R" is connected to one input terminal of the operational amplifier 6 in order to protect the operational amplifier 6 from the surge entrance from the I/O pad, and a reference voltage Vref is applied to the other input terminal.

It is possible to achieve a satisfactory function of protecting the internal circuit against surge by combining a surge protection circuit against ESD or the like denoted by a solid line portion of the input circuit 21 an internal circuit connected to, for example, the terminal 8.

In this case, if the resistor R is connected to the internal power source terminal Vint as denoted by a broken line within the input circuit 21, it is possible to use the input circuit 21 as an input buffer provided with a surge protecting function. It is also possible to use commonly the resistors R, R' and the internal power source terminal Vint in the input circuit 21 functioning as an input buffer and in the output circuit 22 functioning as an output buffer so as to provide the function as an input-output buffer connected to the I/O pad and the surge protecting function against ESD or the like entering through the I/O pad. Incidentally, a single diode D is included in the input circuit 21 and a single diode D' is included in the output circuit 22 in the example shown in FIG. 6. Needless to say, however, it is possible for the input circuit 21 and the output circuit 22 to include a plurality of diodes D and diodes D', respectively.

Some problems remain unsolved in the construction of the MOSFET's Q1, Q2 included in the stacked MOSFET protection circuit. These problems will now be described with reference to FIG. 7. It is necessary for the MOSFET's Q1 and Q2 to absorb a large surge current and, thus, these MOSFET's are required to have several hundred micrometers of the gate width. If the gate width is increased, however, a partial gate breakdown is brought about, from nonuniformity of the device parameters caused by the parasitic resistance, etc., resulting in failure to obtain satisfactory surge protection characteristics.

Figure 7:
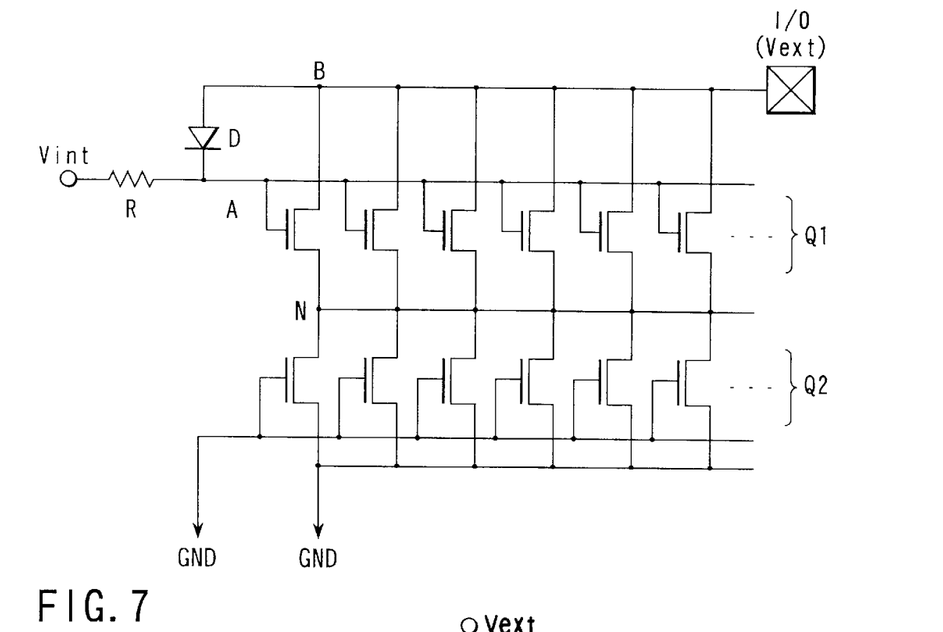
FIG. 7 shows the construction of the MOSFET's Q1, Q2 according to the fourth embodiment of the present invention.

To avoid the difficulty noted above, the MOSFET's Q1 and Q2 are divided into a large number of MOSFET's arranged in parallel and each having a gate width of about 10 micrometers. In this case, the surge current entering node A from the I/O pad through the diode D flows uniformly in a divided fashion through the MOSFET Q1 consisting of a large number of MOSFET's each having a small gate width, making it possible to improve the tolerance to surge of the MOSFET Q1 itself. In this case, the node N between the MOSFET's Q1 and Q2 are connected to each other to form a common node.

The construction of a complementary stacked MOSFET protection circuit according to a fifth embodiment of the present invention will now be described with reference to FIG. 8. If the surge protection circuit of the present invention is applied to, for example, a CMOS type semiconductor device formed by using an internal power source Vint and the ground potential GND, it basically suffices to connect the surge protection circuit on the side of the N-channel MOSFET described in conjunction with the first to fourth embodiments to the surge protection circuit on the side of the inverted P-channel MOSFET by using a common drain.

Figure 8:
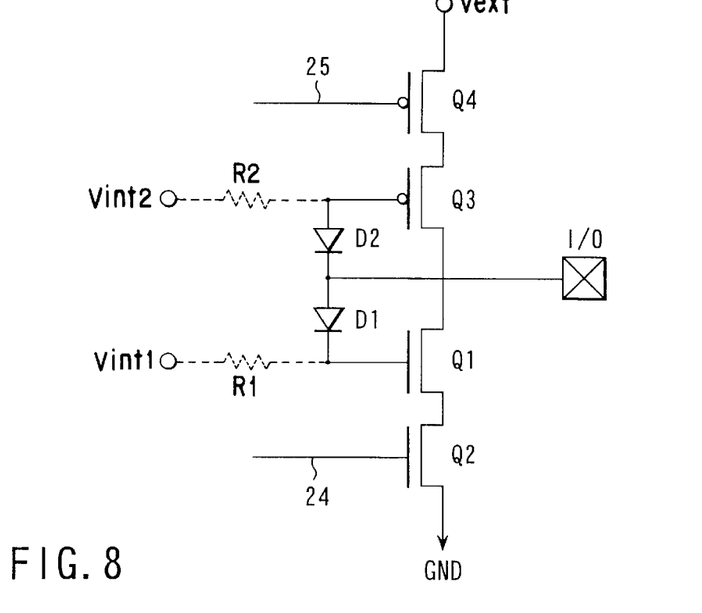
FIG. 8 shows the construction of a complementary stacked MOSFET protection circuit according to a fifth embodiment of the present invention.

FIG. 8 shows the construction of a complementary stacked MOSFET protection circuit. As shown in the drawing, the complementary stacked MOSFET protection circuit comprises N-channel MOSFET's Q1, Q2, P-channel MOSFET's Q3, Q4, diodes D1, D2, resistors R1, R2, and external power sources Vext, internal power sources Vint1 and Vint2.

In the protection circuit shown in FIG. 8, the gate biases of the MOSFET's Q1, Q3, are given by Vint1, Vint2, and the resistors R1, R2. In this case, the I/O buffer is formed in the same circuit configuration as the ESD protection circuit. Alternatively, it suffices to use a circuit configuration of Q1, Q3 gates, which are not connected to Vint1 and Vint2, only for the purpose of ESD protection.

Where the protection circuit shown in FIG. 8 is used as a complementary output buffer, complementary signals are supplied through lines 24, 25 to the gates of the MOSFET's Q2, Q4, respectively, and signals are outputted through the I/O pad connected to the common drain of the MOSFET's Q1, Q2.

The operation of the protection circuit shown in FIG. 8 will now be described. If a positive surge voltage is applied to the I/O pad in the complementary stacked MOSFET protection circuit comprising a single or a plurality of diodes D1, D2, the surge voltage is absorbed by the snap-back characteristics of the N-channel MOSFET's Q1, Q2, and the diodes D1 serves to prevent the breakdown of the gate insulating film in drain edge portion of the MOSFET Q1.

If a negative surge voltage is applied to the I/O pad, the surge voltage is absorbed by the snap-back characteristics of the P-channel MOSFET's Q3, Q4, and the diode D2 serves to prevent breakdown of the gate insulating film in the drain edge portion of the MOSFET Q3.

If the diode D1 is formed of n1 diodes and the diode D2 is formed of n2 diodes, it is necessary to meet both conditions, $n1>(Vext-Vint1)/V_F$, and $N2>(vint2-0)/V_F$.

During normal operation of the complementary semiconductor device, the diodes D1 and D2 are cut off from the gates of the MOSFET's Q1, Q3, and a bias voltage required for operation as an output buffer is supplied from Vint1, Vint2 to the gates of the MOSFET's Q1, Q3. As a result, the complementary stacked MOSFET protection circuit shown in FIG. 8 exhibits the TDDB and HCI reliability and ESD endurance of the complementary semiconductor device without giving any detrimental effect to the normal operation as an output buffer.

Incidentally, the resistors R1, R2 serve to stabilize the clamping characteristics of diodes D1, D2, and to protect the diodes D1, D2 and the internal circuit when a high surge voltage is applied to the I/O pad to permit a large current to flow into the internal power source terminals Vint1, Vint2 through the diodes D1 and D2.

The present invention is not limited to the embodiments described above. For example, in each of the first to fifth embodiments described above, it is possible to use a resistor circuit consisting of a plurality of resistors or an impedance element in place of the protective resistor R. Also, it is possible to use a switching element consisting of, for example, a MOSFET in place of the diode, as already described in conjunction with the second embodiment.

As already described in conjunction with the fourth embodiment, application of the first to fifth embodiments is not limited to an external power source pad or an I/O pad. These embodiments can be applied to the general portions where an external surge may possibly enter. Further, the present invention can be applied in various modified fashions within the technical scope of the present invention.

As described above, in the stacked MOSFET protection circuit of the present invention, a diode or a MOSFET is connected between the gate and the drain of the first MOSFET, where breakdown of the gate insulating film tends to take place in the conventional circuit. The protection circuit of the particular construction exhibits a snap-back voltage appropriate for assuring the reliability of the semiconductor integrated circuit and makes it possible to avoid breakdown of the gate insulating film.

Also, according to the protection circuit of the present invention, the current of the protection circuit is cut off and a voltage higher than a predetermined level is not applied across the gate insulating film during normal operation of the semiconductor integrated circuit. It follows that problems in terms of the reliability such as HCI and TDDB do not take place.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A protection circuit, comprising:
   first and second MOS transistors being of the same channel type and having a source of the first MOS transistor connected to a drain of the second MOS transistor;
   a clamping circuit having first and second terminals, said first terminal being connected to a gate of the first MOS transistor and said second terminal being connected to a drain of the first MOS transistor, the clamping circuit being turned on in a normal state, and in a case where a surge voltage is applied the clamping circuit being turned on to accelerate breakdown of the first MOS transistor; and
   a pad of a semiconductor device connected to the drain of the first MOS transistor, wherein said clamping circuit comprises a plurality of diodes having a cathode of each diode connected to an anode of the adjacent diode, wherein a cathode forming end portion on one side of the plural diodes constitute the first terminal of the clamping circuit, and an anode forming end portion on the other side of the plural diodes constitute the second terminal of the clamping circuit.

2. The protection circuit according to claim 1, wherein the source and gate of the second MOS transistor are connected to the ground.

3. The protection circuit according to claim 1, wherein the clamping circuit serves to maintain constant the potential difference between the first and second terminals when a surge voltage enters the pad.

4. The protection circuit according to claim 1, wherein said pad constitutes a power source pad of a semiconductor device.

5. The protection circuit according to claim 1, wherein said pad constitutes an input/output pad of a semiconductor device.

6. A protection circuit, comprising:
   first and second MOS transistors being of the same channel type and having a source of the first MOS transistor connected to a drain of the second MOS transistor, a drain of the first MOS transistor being connected to an external power supply terminal;
   a switching circuit having first, second and third terminals, said first terminal being connected to a gate of the first MOS transistor, said second terminal being connected to a drain of the first MOS transistor and the external power source terminal, and said third terminal being connected to an internal power source terminal of a semiconductor device, the internal power source terminal being electrically separated from the external power source terminal, the switching circuit acting in a normal operation state to connect the gate of the first MOS transistor to the internal power source terminal and separate the gate of the first MOS transistor from the external power source terminal, and in a case where a surge voltage is applied the switching circuit acting to connect the gate of the first MOS transistor to the external power source terminal and separate the gate of the first MOS transistor from the internal power source terminal to accelerate breakdown of the first MOS transistor, and a pad connected to the drain of the first MOS transistor.

7. The protection circuit according to claim 6, wherein the source and gate of the second MOS transistor are connected to the ground.

8. The protection circuit according to claim 6, wherein said switching circuit serves to electrically cut-off the second terminal during a normal operation of the semiconductor device and to maintain constant a potential difference between the first and second terminals when a surge voltage enters the pad.

9. The protection circuit according to claim 6, wherein said pad constitutes a power source pad of the semiconductor device.

10. The protection circuit according to claim 6, wherein said pad constitutes an input/output pad of the semiconductor device.

11. The protection circuit according to claim 6, wherein said switching circuit consists of a diode, a cathode of said diode being connected to the gate of the first MOS transistor so as to form the first terminal of the switching circuit, and an anode of said diode forming the second terminal of the switching circuit, and the cathode of said diode being connected to the internal power source of the semiconductor device so as to form the third terminal of the switching circuit.

12. The protection circuit according to claim 11, wherein the cathode of the diode is connected via a resistor circuit to the internal power source of the semiconductor device so as to form the third terminal of the switching circuit.

13. The protection circuit according to claim 6, wherein said switching circuit consists of a plurality of diodes having a cathode of each diode connected to an anode of the adjacent diode, a cathode forming end portion on one side of the diodes being connected to the gate of the first MOS transistor so as to form the first terminal of the switching circuit, an anode forming end portion on the other side of the diodes forming the second terminal of the switching circuit, and the cathode forming end portion on one side of the diodes being connected to the internal power source of the semiconductor device so as to form the third terminal of the switching circuit.

14. The protection circuit according to claim 13, wherein the cathode forming end portion on one side of the diodes are connected via a resistor circuit to the internal power source of the semiconductor device so as to form the third terminal of the switching circuit.

15. The protection circuit according to claim 14, wherein a number n (n being a natural number) of said plural diodes is selected to meet a relationship $n>(Vext-Vint)/V_F$, where Vext denotes a voltage of an external power source of the semiconductor device, Vint denotes a voltage of the internal power source, $V_F$ denotes a forward voltage of the diode.

16. The protection circuit according to claim 6, wherein said switching circuit consists of a third MOS transistor with an inverse conductivity type of the first and second MOS transistors, a source of the third MOS transistor being connected to the gate of the first MOS transistor so as to form the first terminal of the switching circuit, a drain of the third MOS transistor forming the second terminal of the switching circuit, a source of the third MOS transistor being connected to a gate of the third MOS transistor, and a gate of the third MOS transistor being connected via a resistor to the internal power source of the semiconductor device so as to form the third terminal.

17. The protection circuit according to claim 16, wherein a threshold voltage Vth of the third MOS transistor is selected to meet a relationship Vth>Vext−Vint, where Vext denotes a voltage of an external power source of the semiconductor device, and Vint denotes a voltage of the internal power source.

18. A protection circuit, comprising:
first and second MOS transistors of a first conductivity type;
third and fourth MOS transistors of a second conductivity type;
first and second diodes;
first and second resistors;
an input/output pad; and
first, second and third power sources,
wherein:
a source of the first MOS transistor is connected to a drain of the second MOS transistor;
a source of the third MOS transistor is connected to a drain of the fourth MOS transistor;
each of a drain of the first MOS transistor and a drain of the third MOS transistor is connected to the input/output pad;
a cathode of the first diode is connected to a gate of the first-MOS transistor and to the first power source via the first resistor;
an anode of the first diode is connected to the input/output pad;
an anode of the second diode is connected to a gate of the third MOS transistor and to the second power source via the second resistor;
a cathode of the second diode is connected to the input/output pad;
a source of the fourth MOS transistor is connected to the third power source; and
a source of the second MOS transistor is connected to the ground.

* * * * *